United States Patent

[11] 3,597,637

[72] Inventors James J. Vandemore
Geneseo, Ill.;
Donald E. Henry, Davenport, Iowa
[21] Appl. No. 812,488
[22] Filed Sept. 27, 1968
[45] Patented Aug. 3, 1971
[73] Assignee Gulf & Western Industries
New York, N.Y.

[54] STATIC OFF-DELAY SWITCHING CIRCUIT
8 Claims, 1 Drawing Fig.

[52] U.S. Cl. ........ 307/252 B,
307/275, 307/293, 307/305
[51] Int. Cl. ........ H03k 17/26
[50] Field of Search ........ 307/252,
275, 293, 305

[56] References Cited
UNITED STATES PATENTS
3,053,995 9/1962 Hallberg ........ 307/275
3,471,716 10/1969 Dinger ........ 307/275

*Primary Examiner*—Donald D. Forrer
*Assistant Examiner*—David M. Carter
*Attorney*—Meyer, Tilberry and Body

ABSTRACT: There is provided an off-delay switching circuit for switching an alternating-voltage supply source across a load at a predetermined period of time after an input signal changes from a first level to a second level, comprising a first electronic control means, such as a triac, having a first, second, and control electrode, and exhibiting the characteristic of presenting a low impedance to current flow from the voltage source to the load when a forward biasing signal is applied to the control electrode; and, circuit means for applying a forward biasing signal to the control electrode of the electronic control means. The circuit means includes first and second actuatable switching means for, when both are actuated, applying a forward biasing signal to the control means; means for periodically, and at a given frequency, actuating the first actuatable switching means; first circuit means responsive to the input signal for developing an output signal at a predetermined time after the input signal changes from the first level to the second level; and, a second electronic control means having a first, second, and control electrode, and exhibiting the characteristics of providing a low impedance to the flow of current between the first and second electrodes from a voltage source coupled across the first and second electrodes upon application of the first level input signal to the control electrode and maintaining the low impedance upon application of the second level input signal to the control electrode until the output signal developed by the first circuit means is applied to the first electrode. The first electrode of the second electronic control means is coupled to the second actuatable switching means to thereby actuate the first electronic control means at a predetermined time after the input signal changes from a first level to a second level.

PATENTED AUG 3 1971 3,597,637
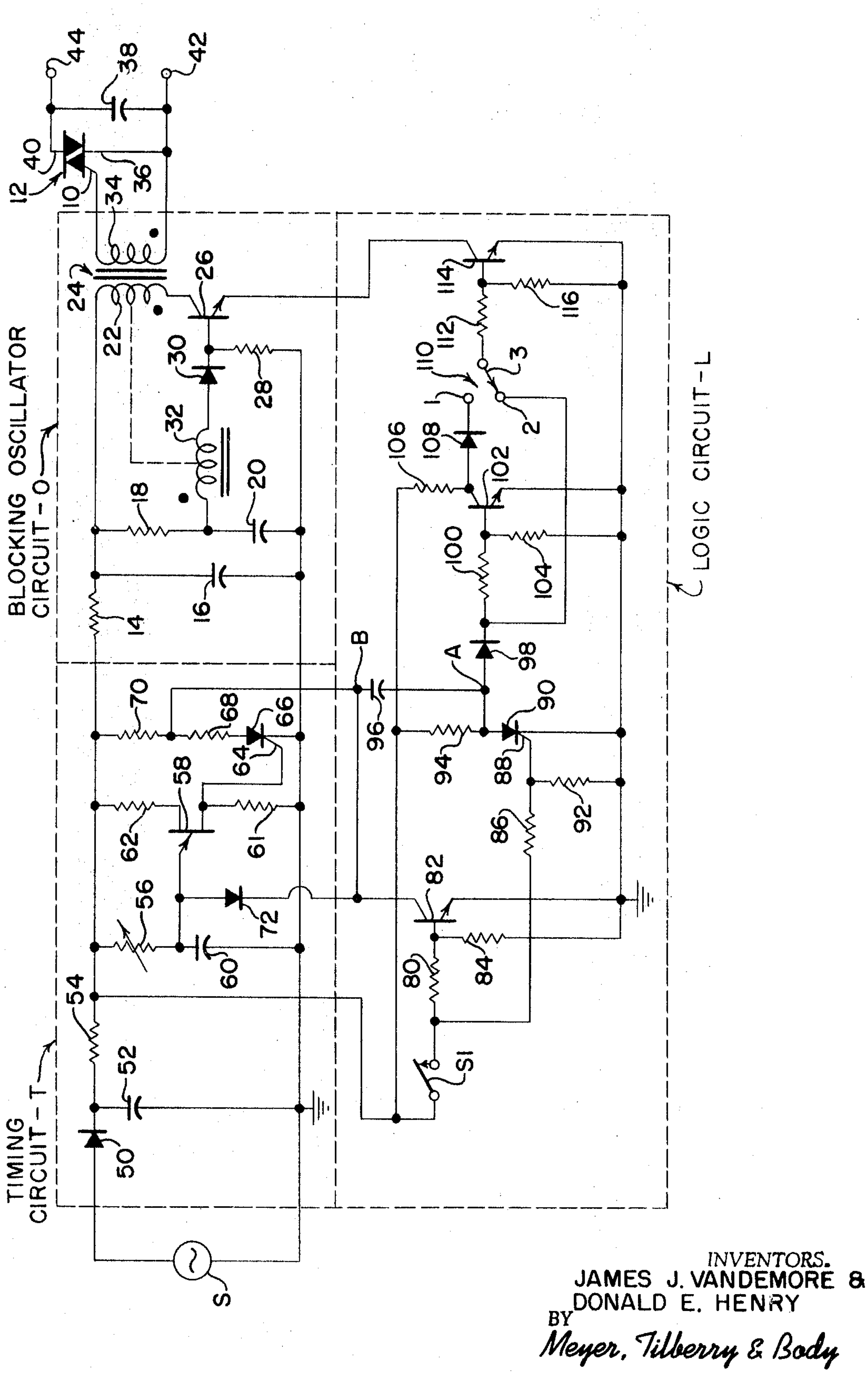
INVENTORS.
JAMES J. VANDEMORE &
DONALD E. HENRY
BY
Meyer, Tilberry & Body
ATTORNEYS

STATIC OFF-DELAY SWITCHING CIRCUIT

The present invention relates to the art of time-delay switching circuits and, more particularly, to such circuits for gating an electronic device, such as a triac, into conduction at a predetermined period of time after an actuating signal is supplied.

The present invention is particularly applicable as a control circuit for a triac, and will be described with particular reference thereto, although it will be appreciated that the invention has broader applications and may be used with other similar switching devices.

Solid-state switching devices, which are triggered into conduction by a gating signal, for controlling the voltage applied to a load have become an important component in a wide variety of control applications. One such device is a silicon-controlled rectifier. This device is limited to use in permitting current conduction in one direction only; therefore, for alternating current applications it is necessary to employ two silicon-controlled rectifiers, poled in reverse directions with the gates of each device separately triggered. More recently, a device known as a triac and described in Application Note 200.35, Mar. 1966, by the General Electric Company, has been employed for controlling the flow of alternating currents. The term triac is a generic term that has been given a three-electrode, alternating-current semiconductive switch.

Time-delay relays known heretofore for switching an alternating-voltage supply source across a load, particularly when high-current capability is required, have included an electronic circuit, such as a resistor-capacitor timing circuit, for energizing an electromechanical load relay after a predetermined period of time to thereby couple the load across the source. As is well known, electromechanical load relays inherently have certain limitations, to wit, relatively low speed operation, unreliable operation in adverse environments, relatively short life due to contact pitting, et cetera.

The present invention contemplates a new and improved time-delay circuit for controlling a switching device which overcomes all of the above referred-to problems, and others, and provides a circuit which is reliable in operation.

In accordance with the present invention, there is provided a circuit for forwarding biasing a first electronic control means, such as a triac, at a predetermined period of time after an input signal changes from a first level to a second level comprising: first and second actuatable switching means for, when both are actuated, applying a forwarding biasing signal to the first electronic control means; means for actuating the first actuatable switching means; first circuit means responsive to the input signal for developing an output signal at a predetermined time after the input signal changes from the first level to the second level; and, second electronic control means having a first, second, and control electrode, and exhibiting the characteristics of providing a low impedance to the flow of current between the first and second electrodes from a voltage source coupled across the first and second electrodes, upon application of a first level input signal to the control electrode and maintaining the low impedance upon application of a second level input signal to the control electrode until the output signal developed by the first circuit means is applied to the first electrode; the first electrode of the second electronic control means being coupled to the first circuit means and the second actuatable switching means so that the second actuatable switching means is actuated at a predetermined time after the input signal changes from a first level to a second level.

In accordance with a more limited aspect of the present invention, there is provided a switching circuit for switching an alternating voltage source across a load at a predetermined period of time after an input signal changes from a first level to a second level, comprising: static switch means having a first, second, and control electrode, and exhibiting the characteristic of presenting a low impedance to current flow from the alternating voltage source to the load when a forward biasing signal is applied to the control electrode; and circuit means for applying a forward biasing signal to the control electrode The circuit means includes first and second actuatable switching means for, when both are actuated, applying a forward biasing signal to the control electrode of the static switch means; means for periodically, and at a given frequency, actuating the first actuatable switching means; first circuit means responsive to the input signal for developing an output signal at a predetermined time after the input signal changes from a first level to a second level; and, electronic control means having a first, second and control electrode, and exhibiting the characteristics of providing a low impedance to the flow of current between the first and second electrodes from a voltage source coupled across the first and second electrodes upon application of a first level input signal to the control electrode and maintaining the low impedance upon application of a second level input signal to the control electrode until the output signal developed by the first circuit means is applied to the first electrode; the first electrode being coupled to the second actuatable switching means so that the second actuatable switching means is actuated at a predetermined time after the input signal changes from a first level to a second level to thereby apply a forward biasing signal to the static switch means.

The principle object of the present invention is to provide a circuit for actuating a static switching device to thereby switch an alternating-voltage source across a load at a predetermined period of time after actuation of a switch.

Another object of the present invention is to provide a solid-state circuit for switching an alternating-voltage source across a load at a predetermined period of time after receipt of an input signal.

Another object of the present invention is to provide a solid-state, time-delay switching circuit in which the condition of the output terminal prior to timing, during timing, and upon completion of timing may be altered by varying the position of a switch.

A further object of the present invention is to provide a semiconductor time-delay switching circuit for switching an alternating voltage source across a load at a predetermined period of time after a switch is opened.

A further object of the present invention is to provide a solid-state time-delay switching circuit having a relatively high current switching capability.

A further object of the present invention is to provide a solid-state, time-delay relay being capable of high-speed operation, reliable operation in adverse environments, and in which the life of the relay is independent of the number of switching operations.

A further object of the present invention is to provide a semiconductor time-delay switching circuit which is capable of operation at relatively high temperatures, i.e. excess of 100° C.

A still further object of the present invention is to provide a time-delay circuit for actuating a semiconductor switching device in which the gating signal takes the form of a relatively short time-duration pulse to thereby increase the ambient temperature at which the device is capable of operation.

A further object of the present invention is to provide an improved time-delay circuit for gating a triac into conduction.

These and other objects and advantages of the invention will become apparent from the following description of the preferred embodiment of the invention as read in conjunction with the accompanying drawing in which:

The FIGURE is a schematic circuit diagram illustrating a circuit for gating a triac into conduction after a predetermined period of time in accordance with the preferred embodiment of the present invention.

References now made to the drawing, wherein the showings are for purposes of illustrating a preferred embodiment of the present invention and not for purposes of limiting same, the FIGURE illustrates a control circuit for gating a triac, and generally comprises a timing circuit T connected through a logic circuit L and blocking oscillator circuit 0, to the control electrode 10 of a triac 12.

BLOCKING OSCILLATOR CIRCUIT

Blocking oscillator circuit O, as is more particularly described in U. S. Pat. application, Ser. No. 730,212, filed Apr. 16, 1968, and entitled "High Temperature Semiconductor Switching Circuit," includes a resistor 14 having one terminal connected to timing circuit T, and the other terminal connected through a capacitor 16 to ground. Connected to the junction between resistor 14 and capacitor 16 is one terminal of a resistor 18 having the other terminal thereof connected through a capacitor 20 to ground. Also connected to the junction between resistor 14 and capacitor 16 is one terminal of a primary winding 22 of a transformer 24. Connected to the other terminal, or the positive-polarity indicated end, of primary winding 22 is the collector of an NPN transistor 26 having the base thereof connected through a resistor 28 to ground. Also connected to the base of transistor 26 is the cathode of a diode 30 having the anode thereof connected to one terminal of a feedback winding 32 of transformer 24. The other terminal, or the positive-polarity indicated end, of feedback winding 32 is connected directly to the junction between resistor 18 and capacitor 20. The emitter of transistor 26 is connected to one terminal of logic circuit L. One terminal of a secondary winding 34 of transformer 24 is connected to the control electrode 10, or gate terminal, of triac 12, and the other terminal, or positive-polarity indicated end of secondary winding 34 is connected directly to the first terminal 36 of triac 12. A capacitor 38 is connected between the first terminal 36 and a second terminal 40 of triac 12, and the first terminal 36 and second terminal 40 of triac 12 provide the output terminals 42 and 44, respectively.

TIMING CIRCUIT

Timing circuit T includes an alternating-voltage supply source S having one terminal connected directly to ground, and the other terminal connected to the anode of a diode 50. The cathode of diode 50 is connected through a capacitor 52 to ground, and through a resistor 54 to one terminal of a potentiometer 56. The other terminal of potentiometer 56 is connected directly to the base of a unijunction transistor 58, and is also connected through a capacitor 60 to ground. The first base of unijunction transistor 58 is connected through a resistor 61 to ground, and the second base of this transistor is connected through a resistor 62 to the junction between resistor 54 and potentiometer 56. Also connected to the first base of unijunction transistor 58 is the control electrode 64 of a silicon-controlled rectifier 66. The cathode of silicon-controlled rectifier 66 is connected directly to ground, and the anode of this device is connected through a pair of series-connected resistors 68 and 70 to the junction between resistor 54 and potentiometer 56. Also connected to the base of unijunction transistor 58 is the anode of a diode 72 having the cathode thereof connected to one terminal of logic circuit L.

LOGIC CIRCUIT

Logic circuit L includes a normally closed switch S1 having one terminal thereof connected to the junction between resistor 54 and potentiometer 56, and the other terminal connected through a resistor 80 to the base of an NPN transistor 82. As may be readily apparent, normally closed switch S1 may be deleted from the circuit and an external direct-current source may be coupled through resistor 80 to transistor 82, if it is desirable to actuate the circuit externally.

The base of transistor 82 is connected through a resistor 84 to ground, the emitter is connected directly to ground, and the collector of this transistor is connected to the cathode of diode 72 in timing circuit T. The junction between switch S1 and resistor 80 is connected through a resistor 86 to the control electrode 88 of a silicon-controlled rectifier 90. The control electrode 88 of silicon-controlled rectifier 90 is also connected through a resistor 92 to ground, and the cathode of this rectifier is connected directly to ground. Connected to the anode of silicon-controlled rectifier 90 is one terminal of a resistor 94 having the other terminal thereof connected to the junction between resistor 54 and potentiometer 56. Also connected to the anode of silicon-controlled rectifier 90 is one terminal of a capacitor 96 having the other terminal thereof connected to the collector of transistor 82, and to the junction between resistors 68 and 70 of timing circuit T. The anode of silicon-controlled rectifier 90 is also connected through a diode 98, poled as shown in the FIGURE, and through a resistor 100 to the base of an NPN transistor 102. The base of transistor 102 is connected through a resistor 104 to ground, and the emitter of this transistor is connected directly to ground. Connected to the collector of transistor 102 is one terminal of a resistor 106 having the other terminal thereof connected to the junction between resistor 54 and potentiometer 56. The collector of transistor 102 is connected to the anode of a diode 108 having its cathode connected to terminal 1 of a single-pole, double-throw switch 110. Terminal 2 of switch 110 is connected directly to the junction between diode 98 and resistor 100.

The movable arm 3 of switch 110 is connected through a resistor 112 to the base of an NPN transistor 114 having the base thereof connected through a resistor 116 to ground, and the emitter connected directly to ground. The collector of transistor 114 is connected to the emitter of transistor 26 of blocking oscillator circuit O.

OPERATION OF BLOCKING OSCILLATOR CIRCUIT

The signal supplied by alternating-voltage supply source S is rectified through the network comprised of diode 50, capacitor 52, resistors 54 and 14, and capacitor 16, to thereby provide a direct-current signal which will charge capacitor 20 through resistor 18, and will also cause transformer 24 to begin to store energy in primary winding 22. As energy is gradually stored in primary winding 22, a voltage of increasing amplitude is induced in feedback winding 32 of the polarity indicated with reference to the polarity dot. The voltage induced in feedback winding 32 is applied through diode 30 to gradually forward bias transistor 26 into conduction. Once transistor 26 commences to conduct, capacitor 20 rapidly discharges through primary winding 22 and transistors 26 and 114 to ground, assuming transistor 114 is forward biased into conduction.

When capacitor 20 discharges through primary winding 22, a voltage impulse of short duration is developed across primary winding 22, which in turn induces a similar pulse in secondary winding 34 to thereby apply a short duration gating signal to control electrode 10 of triac 12. This gating signal causes triac 12 to switch from an "off" to an "on" condition. In the "on" condition, a closed path is completed between terminals 42 and 44, which path will be maintained until an alternating voltage signal supplying a load passes through approximately a zero-voltage level. Because the gating pulse is of a very short duration, excessive current is not applied to the control electrode 10 of triac 12, and operation at high temperatures is made possible.

Also, upon saturation of the core of transformer 24, the induced current through feedback winding 32 terminates, and the forward biasing signal applied to transistor 26 terminates, to thereby cause this transistor to again become reverse biased. Once transistor 26 becomes reverse biased, capacitor 20 will again begin to charge to thereby commence another cycle of operation. When transistor 114 is reverse biased, the oscillator circuit including transistor 26 will cease to oscillate since there will be no path for the discharge of capacitor 20. Transistor 114 is actuated by the signal supplied upon timing circuit T and logic circuit L.

OPERATION OF TIMING AND LOGIC CIRCUITS

Prior to opening normally closed switch S1 transistor 82 is forward biased to thereby cause capacitor 60 to discharge and remain in a discharged condition through diode 72 and transistor 82. Also, with switch S1 in a closed position, a positive signal is applied to the control electrode 88 of silicon-controlled rectifier 90. When a positive signal is applied to the control electrode 88 of silicon-controlled rectifier 90, the signal appearing at terminal A will take the form of a binary "O" signal. By a binary "O" signal is meant a signal equal to approximately ground potential, and by a binary "1" signal is meant a signal of some positive potential. The binary "O" signal appearing at terminal A will cause a binary "O" signal to appear at terminal 2 of switch 110, and will also cause transistor 102 to become reverse biased. With transistor 102 in a nonconductive condition, a binary "1" signal will appear at terminal 1 of switch 110.

Timing commences upon opening normally closed switch S1. When switch S1 is opened, transistor 82 will become reverse biased thereby allowing capacitor 60 to commence charging through potentiometer 56. As may be readily apparent, the time required for capacitor 60 to charge to a predetermined value, i.e., potentiometer 56 may be varied to alter the timing cycle of operation. During the timing cycle, a binary "1" signal will appear at terminal B since transistor 82 and silicon-controlled rectifier 66 remain in nonconductive states. Also, with switch S1 opened, a binary "O" signal will be applied to the control electrode 88 of silicon controlled rectifier 90; however, since a binary "1" signal is applied to terminal B, the anode of silicon-controlled rectifier 90 will remain slightly positive with respect to the cathode to thereby cause silicon-controlled rectifier 90 to remain in a conductive state even though the binary "1" signal applied to control electrode 88 is removed. With silicon controlled rectifier 90 in a conductive state, a binary "O" signal will appear at terminal A and at terminal 2 of switch 110. The binary "O" signal applied to terminal A will also cause transistor 102 to remain in a nonconductive state thereby causing terminal 1 of switch 110 to remain at a binary "1" signal level.

When the voltage developed across capacitor 60 obtains a level sufficient to cause unijunction transistor 58 to fire or "avalanche," i.e., after timeout, a voltage will be developed across resistor 61 to thereby gate silicon-controlled rectifier 66 into conduction. When silicon-controlled rectifier 66 becomes conductive, the signal applied to terminal B will change abruptly from a binary "1" to a binary "O" signal, or approximately ground potential. This change in voltage at terminal B will cause the slightly positive voltage at terminal A or the anode of silicon-controlled rectifier 90, to decrease abruptly to approximately ground potential. When the voltage at the anode of silicon-controlled rectifier 90 decreases to approximately ground potential with respect to the cathode, silicon-controlled rectifier 90 will become nonconductive since the signal applied to control electrode 88 remains at a binary "O" signal level. When silicon controlled rectifier 90 switches to a nonconductive state, a binary "1" signal will be applied to terminal A, which in turn will cause a binary "1" signal to appear at terminal 2 of switch 110. Further, the binary "1" signal appearing at terminal A will cause transistor 102 to become forward biased thereby causing a binary "O" signal to appear at terminal 1 of switch 110.

To reset the circuit for a subsequent timing operation, switch S1 is closed to thereby forward bias transistor 82 into conduction. When transistor 82 becomes conductive, capacitor 60 will again discharge and remain discharged through diode 72 and transistor 82. The base of unijunction transistor 58 is returned to approximately ground potential and the voltage developed across resistor 61, or the signal applied to the control electrode 64 of silicon-controlled rectifier 66, will return to a binary "O" signal level. Also, with transistor 82 in a conductive state the anode of silicon-controlled rectifier 66 will be at approximately ground potential with respect to the cathode thereby allowing this device to revert to a nonconductive condition. Further, when switch S1 is closed, a binary "1" signal will be applied to the control electrode 88 of silicon-controlled rectifier 90 to thereby again forward bias this device into conduction. With silicon-controlled rectifier 90 again in a conductive state the signal applied to terminals 1 and 2 of switch 110 will again take the form of a binary "1" and a binary "O" signal, respectively.

When a binary "O" signal appears at terminal 2 of switch 110, assuming movable arm 3 is in the position as illustrated in the figure, a binary "O" signal will be applied to the base of transistor 114 thereby reverse biasing this transistor. If a binary "1" signal appears at terminal 2 of switch 110, transistor 114 will become forward biased into conduction, thereby commencing operation of blocking oscillator circuit O.

As is readily apparent, with movable arm 3 of switch 110 in the position as illustrated in the FIGURE, a closed circuit is completed between output terminals 42 and 44 through triac 12, i.e. triac 12 becomes conductive at a predetermined period of time after closure of switch S1. If however, movable arm 3 of switch 110 is moved to terminal 1, triac 12 will be conductive prior to, and during the timing cycle, and become nonconductive after the timing period.

In accordance with the preferred embodiment of the invention, the binary signals appearing at terminals 1 and 2 of switch 110, and the conditions of output terminals 42 and 44 of triac 12 during the timing phases are illustrated in Table I;

TABLE I

| | Signal appearing (at terminal) | | Condition of output (movable arm 3 at terminal) | |
|---|---|---|---|---|
| | 1 | 2 | 1 | 2 |
| Prior to timing | "1" | "0" | Closed | Open. |
| During timing | "1" | "0" | do | Do. |
| Time-out | "0" | "1" | Open | Closed. |

Although the invention has been shown in connection with the preferred embodiment, it will be readily apparent to those skilled in the art that various changes in form, such as, replacement of switch S1 with an external signal source in order to provide external control of the circuit, may be made without departing from the spirit and scope of the invention as defined by the appended claims.

We claim:

1. A time delay switching circuit for switching an alternating voltage source across a load at a predetermined period after an input signal changes from a first level to a second level comprising:

static switch means having a first, second, and control electrode and exhibiting the characteristic of presenting a low impedance to current flow from an alternating voltage source to a said load when a forward biasing signal is applied to said control electrode;

circuit means for applying a forward biasing signal to said control electrode including:

generating means and actuatable switching means, for, when both are actuated, applying a said forward biasing signal to said control electrode of said static switch means;

means for actuating said generating means;

first circuit means responsive to an input signal for providing an output signal at a predetermined time after a said input signal changes from a first level to a second level; and, electronic control means having a first, second, and control electrode, and exhibiting the characteristics of providing a low impedance to the flow of current between the first and second electrodes from a source supply coupled across the first and second electrodes upon application of said first level signal to the control electrode and maintaining the low impedance upon application of a second level signal to the control electrode until said output signal developed by said first circuit is applied to said first electrode, said control means being coupled to said actuatable switching means so that said actuatable switching means is actuated at a predetermined time after a said input signal changes from a said first level to a said second level.

2. A switching circuit as defined in claim 1 wherein said biasing circuit means includes an input circuit means coupled to said control electrode of said electronic control means for receiving an input signal, said input circuit means having a first and second condition respectively providing said first level signal and second level signal; and, said static switch means is a triac having a first, second and control electrode, said first and second electrodes being adapted to be coupled to said load, and said control electrode being coupled to said generating means and said actuatable switching means.

3. A switching circuit as defined in claim 1 wherein said actuatable switching means includes a second electronic control means having a first, second and control electrode, and having a first and a second condition; and, a second circuit means coupling said first electronic control means to the control electrode of said second electronic control means and including a switch means for altering the condition that said first electronic control means takes after said input signal changes from said first level to said second level.

4. A switching circuit as defined in claim 3 wherein said means for actuating said generating means comprises means for periodically, and at a given frequency, actuating said generating means; and, said first circuit means includes a third electronic control means having an input circuit for receiving a control signal, a reverse biasing circuit for applying a reverse biasing voltage to said third control means, an output circuit for providing a said output signal, and a timing capacitor connected across said input circuit for storing voltage, said third control means being forward biased when the value of the stored voltage is equal to a characteristic voltage to thereby develop said output signal.

5. A switching circuit as defined in claim 4 wherein the generating means includes a transformer having a primary and a secondary winding, said secondary winding being connected between said first and said control electrodes of said static switch means; and, said generating means and said actuatable switching means being coupled to said alternating-voltage source in series with said primary winding of said transformer, for, when said generating means and said actuatable switching means are actuated, completing a circuit between said primary winding and said source.

6. In a triac switching circuit for switching an alternating voltage source across a load at a predetermined period of time after an input signal changes from a first level to a second level, a circuit for providing a forward biasing signal including:

generating and actuatable switching means for, when both are actuated, apply a said forward biasing signal to a said triac;

means for actuating said generating means;

first circuit means responsive to a said input signal for developing and output signal at a predetermined time after a said input signal changes from a said first level to a said second level; and, electronic control means having a first, second, and control electrode, and exhibiting the characteristics of providing a low impedance to the flow of current between the first and second electrodes from a source supply coupled across the first and second electrodes upon application of said first level input signal to the control electrode and maintaining the low impedance upon application of said second level input signal to the control electrode until said output signal developed by said first circuit means is applied to said first electrode, said electronic control means being coupled to said actuatable switching means for actuating said switching means so that said second actuatable switching means is actuated at predetermined time after said input signal changes from a first level to a second level.

7. In a circuit as defined claim 6 wherein said means for actuating said generating means is a means for periodically, and at a given frequency, actuating said generating means, and said actuatable switching means includes a second electronic control means having a first, second, and control electrode, said first electrode of said second electronic control means being coupled to said generating means, and said control electrode of said second electronic control means being coupled to said first electronic control means.

8. In a circuit as defined claim 7 including an input circuit means for receiving an input signal having a first and a second condition respectively providing said first level signal and said second level signal, said input circuit means coupled to said first electronic control means for applying said first level signal and said second level signal to the control electrode of said first electronic control means; and, said generating means includes a transformer having a primary and a secondary winding; said generating and actuatable switching means, for upon actuation, coupling said primary winding to said source and said secondary winding being adapted to be coupled to said triac.